United States Patent
Kremin et al.

(10) Patent No.: US 8,866,493 B2
(45) Date of Patent: Oct. 21, 2014

(54) NOISE SUPPRESSION AND/OR REDUCTION CIRCUITS AND METHODS FOR CAPACITANCE SENSING SYSTEMS

(75) Inventors: Victor Kremin, Lviv (UA); Erik Anderson, Shoreline, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 401 days.

(21) Appl. No.: 13/216,556

(22) Filed: Aug. 24, 2011

(65) Prior Publication Data

US 2012/0049869 A1 Mar. 1, 2012

Related U.S. Application Data

(60) Provisional application No. 61/376,642, filed on Aug. 24, 2010, provisional application No. 61/376,510, filed on Aug. 24, 2010, provisional application No. 61/376,493, filed on Aug. 24, 2010.

(51) Int. Cl.
  *G06F 3/044* (2006.01)
  *G06F 3/041* (2006.01)
  *G01R 29/26* (2006.01)
  *G01D 5/24* (2006.01)

(52) U.S. Cl.
  CPC ............ *G06F 3/0412* (2013.01); *G01R 29/26* (2013.01); *G06F 3/044* (2013.01); *G01D 5/24* (2013.01)
  USPC ....................................................... 324/613

(58) Field of Classification Search
  USPC ........................................................ 324/613
  See application file for complete search history.

(56) References Cited

U.S. PATENT DOCUMENTS

| | | | | |
|---|---|---|---|---|
| 4,539,527 A | * | 9/1985 | Ishigaki et al. | 330/149 |
| 4,555,669 A | * | 11/1985 | Namiki | 330/149 |
| 5,172,065 A | * | 12/1992 | Wallrafen | 324/683 |
| 6,150,826 A | * | 11/2000 | Hokodate et al. | 324/662 |
| 7,355,435 B2 | * | 4/2008 | Ferraiolo et al. | 324/750.3 |
| 8,433,077 B2 | * | 4/2013 | Suezawa | 381/94.1 |
| 2006/0071671 A1 | | 4/2006 | Tola et al. | |
| 2008/0042661 A1 | * | 2/2008 | Reynolds | 324/688 |
| 2008/0061800 A1 | | 3/2008 | Reynolds et al. | |
| 2009/0224775 A1 | | 9/2009 | Nishizono | |
| 2011/0084709 A1 | * | 4/2011 | Asjes et al. | 324/658 |

FOREIGN PATENT DOCUMENTS

| | | | |
|---|---|---|---|
| JP | 09-178407 | * | 7/1997 |
| JP | 2008542760 A | | 11/2008 |
| JP | 2009178407 A | | 8/2009 |

OTHER PUBLICATIONS

International Search Report for International Application No. PCT/US2011/048750 Mailed on Feb. 27, 2012; 5 pages.
Written Opinion of the International Searching Authority for International Application No. PCT/US2011/048750 Mailed on Feb. 27, 2012; 4 pages.

\* cited by examiner

*Primary Examiner* — Jeff Natalini

(57) ABSTRACT

A capacitance sensing system can include a noise detector coupled to a capacitance sensing network that generates a noise detect signal in response to noise; a delay circuit coupled to generate at least two different delayed sense signals in response to outputs from the capacitance sensing network; and a switch circuit that selectively outputs one of the delayed sense signals in response to the noise detect signal. Particular embodiments can include selectively discarding discrete analog samples of a capacitance signal when noise is detected in such a sample.

14 Claims, 16 Drawing Sheets

| Parameter | Value |
|---|---|
| Conversion result w/o Noise | 10.275 V |
| Conversion result absolute value w/ Noise suppression DISABLED, peak-to-peak values | 266 mV (2.16%) |
| Conversion result absolute value w/ Noise suppression ENABLED, peak-to-peak values | 42 mV (0.4%) |

FIG. 9

| Period down scaling factor | Minimum Noise interval | Converted Value | Conversion time |
|---|---|---|---|
| No noise | - - | 10.275 V | 140 us |
| 1 | 4.27 us | 10.281 V | 203 us |
| 0.8 | 3.41 us | 10.270 V | 233 us |
| 0.6 | 2.50 us | 10.271 V | 308 us |
| 0.5 | 2.13 us | 10.268 V | 427 us |
| 0.4 | 1.70 us | 10.450 V | 459 us |
| 0.25 | 1.06 us | 10.280 V | 850 us |

FIG. 10

| Parameter | Value |
|---|---|
| Conversion result w/o Noise | 18.1 V |
| Conversion result absolute value w/ Noise suppression DISABLED, peak-to-peak values | 0.457 V (2.52%) |
| Conversion result absolute value w/ Noise suppression ENABLED, peak-to-peak values | 0.038 V (0.2%) |

FIG. 12

| Period down scaling factor | Minimum Noise interval | Converted Value | Conversion time |
|---|---|---|---|
| No noise | - - | 18.10 V | 140 us |
| 1 | 4.27 us | 18.09 V | 140 us |
| 0.8 | 3.41 us | 17.75 V | 140 us |
| 0.6 | 2.50 us | 17.77 V | 140 us |
| 0.5 | 2.13 us | 17.10 V | 140 us |
| 0.4 | 1.70 us | 18.25 V | 140 us |
| 0.25 | 1.06 us | 10.25 V | 140 us |

FIG. 13

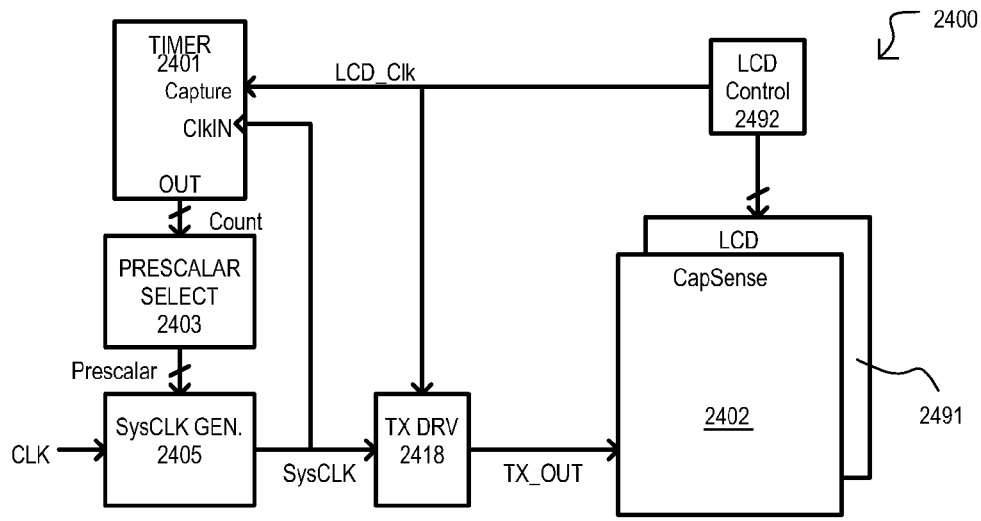
FIG. 24
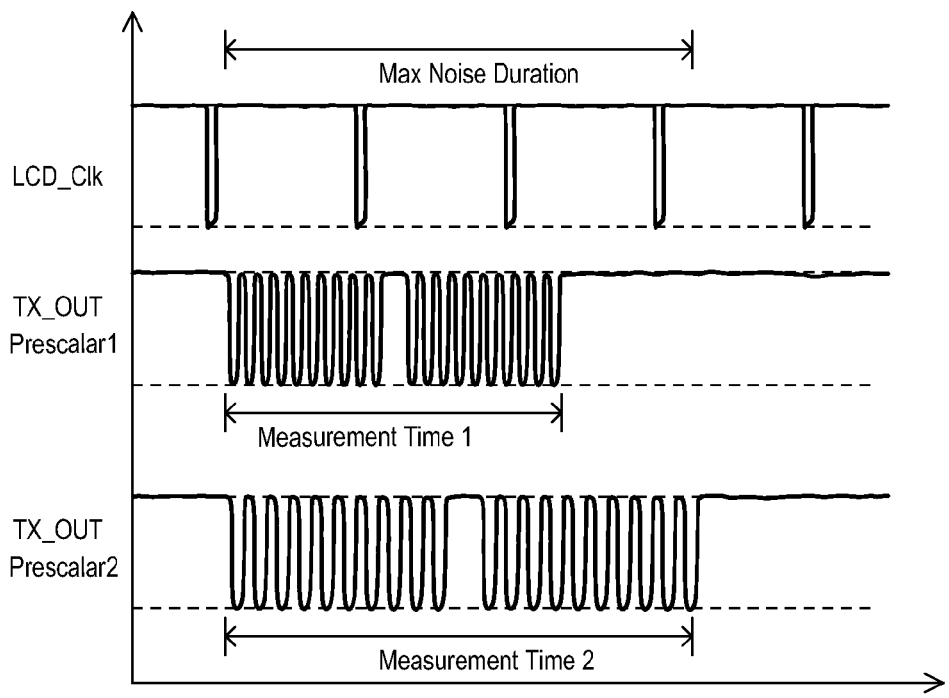
FIG. 25
|  | NO LCD | LCD | LCD+SYNC |
|---|---|---|---|
| TOUCH SIGNAL | 50 | 50 | 50 |
| NOISE | 2 | 15 | 7 |
| SNR | 25 | 3.3 | 7 |
FIG. 26 even when not aligned to any
NOISE SUPPRESSION AND/OR REDUCTION CIRCUITS AND METHODS FOR CAPACITANCE SENSING SYSTEMS This application claims the benefit of U.S. Provisional patent applications having Ser. No. 61/376,642, filed on Aug. 24, 2010, Ser. No. 61/376,510, filed on Aug. 24, 2010, and Ser. No. 61/376,493, filed on Aug. 24, 2010, the contents of all of which are incorporated by reference herein.

TECHNICAL FIELD

The present disclosure relates generally to capacitance sensing systems, and more particularly to noise suppression in such systems.

BRIEF DESCRIPTION OF THE DRAWINGS

FIGS. 9 and 10 are tables showing simulation results for a noise suppression operation like that shown in FIG. 8.

FIGS. 12 and 13 are tables showing simulation results for a noise suppression operation like that shown in FIG. 11.

FIG. 24 is a block schematic diagram of a capacitance sense system having noise reduction based on synchronizing capacitance measuring times and/or setting measuring durations based on expected noise characteristics.

FIG. 25 is a timing diagram showing operations of a system like that of FIG. 24.

FIG. 26 is a table showing experimental results for a noise reduction system like that shown in FIG. 25.

DETAILED DESCRIPTION

Figure 1:
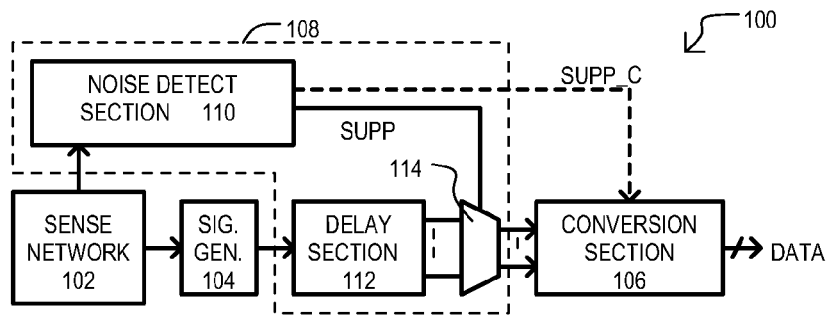
FIG. 1 is a block schematic diagram of a capacitance sensing system having noise suppression according to an embodiment.

Various embodiments will now be described that show capacitance sensing systems and methods that can suppress and/or reduce noise arising on a capacitance sensing network.

Particular embodiments can reduce the adverse effects of pulsed noise. Pulsed noise can be noise spikes on a monitored signal that is typically followed by a "clean" (i.e., little or no noise) signal. In very particular embodiments, a monitored signal can be a periodic signal in which noise events are typically followed one or more clean half-cycles.

Embodiments can also reduce the adverse effects of noise by setting a sensing signal frequency to be a multiple of a noise repeating frequency. In such an arrangement, noise frequency harmonics can be located at zeros of the sensing channel frequency response.

In the various embodiments shown below, like section are referred to by the same reference character but with the first digit(s) corresponding to the figure number.

FIG. 1 shows a capacitance sensing system 100 according to a first embodiment in a block schematic diagram. A system 100 can include a sense network 102, a signal sensing unit 104, a conversion section 106, and a noise suppression section 108. A sense network 102 can detect changes in capacitance, such as those arising from changes in an object position relative to a sensing area or surface. Such changes in capacitance can be converted into sense signals by signal sensing unit 104. Sense signals can include voltages, currents and/or charge, as a few examples.

A conversion section 106 can generate an output value representative of a sensed capacitance. In the embodiment shown, a conversion section 106 can provide a digital value in response to a received value within a time period referred to herein as a "conversion time".

In FIG. 1, a noise suppression section 108 can include a noise detection section 110, a delay section 112, and a switch circuit 114. A noise detection section 110 can detect noise events in the sense network 102. In response to the detection of noise, a noise detection section 110 can activate a suppression signal (SUPP). A noise detection section 110 can detect noise in any suitable fashion, including signal levels (e.g., capacitance, a charge corresponding to a capacitance, a voltage corresponding to a capacitance) that exceed some minimum and/or maximum value, or that exceed some minimum rise and/or fall time, to name but a few examples.

A delay section 112 can receive a sequence of sense signals from signal sensing unit 104, and can delay such a sequence to generate two or more delayed sense signals. A switch circuit 114 can selectively output sense signals in response to an activation of suppression signal (SUPP). Accordingly, if a noise event is detected within sense network, the corresponding sense signal (which would include the effects of the detected noise) is not passed through to a conversion section 106. In some embodiments, in place of the "noisy" sense signal, a delayed version of the sense signal can be provided by switch circuit 114 to conversion section.

Optionally, a conversion section 106 can selectively alter a conversion time in response to an activation of a suppression signal (SUPP_C). In some embodiments, suppression signal SUPP_C can be the same as SUPP.

In this way, upon detection of a noise event, a capacitance sensing system can prevent a sense signal containing the noise from being converted into a capacitance output value.

Particular embodiments can employ noise suppression of pulsed noise utilizing discrete analog signal processing. In some embodiments, analog signals generated from a capacitance sense array can be separated into discrete time samples, and when noise is detected in a sample, the noisy sample can be removed from any further processing by an analog integration of the noisy sample and/or by substituting the noisy sample with a subsequent sample, which can be a clean sample.

Figure 2:
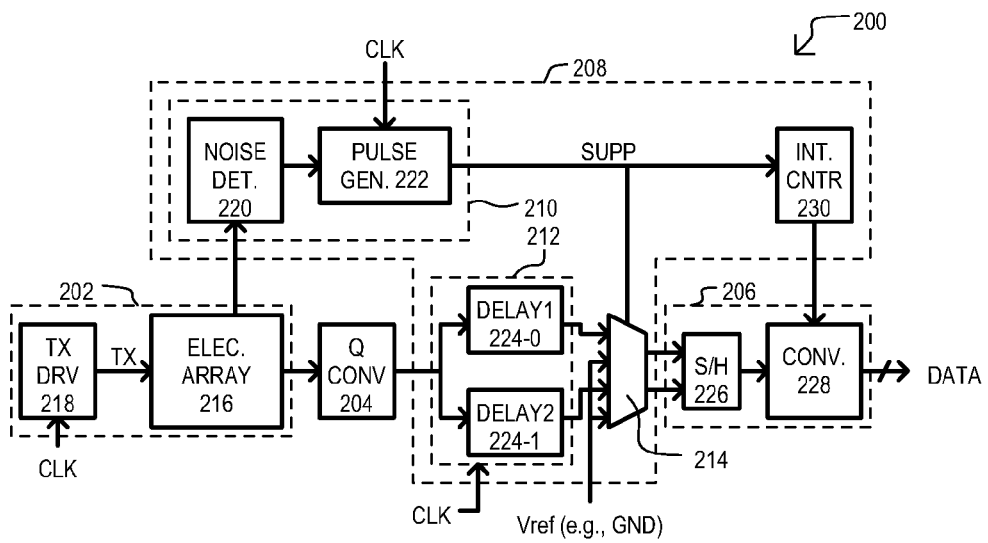
FIG. 2 is a block schematic diagram of a capacitance sensing system having gated conversion noise suppression according to an embodiment.

FIG. 2 shows a capacitance sensing system 200 according to another embodiment in a block schematic diagram. In one embodiment, a system 200 can be one particular implementation of that shown in FIG. 1. System 200 can be considered a "gated conversion" type system, as it selectively gates sensed capacitance values to a converter depending upon detected noise. That is, if noise is detected, a sense signal corresponding to the noise can be prevented from passing through to a converter stage that generates a capacitance output value.

In FIG. 2, a sense network 202 can be a mutual capacitance sensing network that include an electrode array 216 and a transmit (TX) signal generator 218. An electrode array 216 can include TX electrodes coupled to receive (RX) electrodes by a mutual capacitance. Such a mutual capacitance can vary in response to the proximity of a sense object(s). A TX signal generator 218 can drive TX electrodes with a signal (TX) to thereby induce signals on RX electrodes that will reflect any change in mutual capacitance. In particular embodiments, a TX signal generator 218 can drive TX electrodes with a periodic signal during a measurement time.

A sense network 202 may be susceptible to noise from other circuits or circuit operations. In one embodiment, a sense network 202 can be physically connected to a display device that can create noise on the sense network 202. In a very particular embodiment, a sense network 202 can be a transparent capacitive sensing surface formed on a display screen.

A sense signal generator 204 can be an input charge conversion circuit that converts charge generated on RX electrodes into a voltage and/or current value for input into delay section 212. In a particular embodiment, sense signal generator 204 provides voltage signals generated in response to a TX signal that is synchronized to a clock signal CLK.

Noise detection section 210 can include a noise detect circuit 220 and a pulse generator 222. Thus, a noise detect circuit 220 can detect a noise event occurring within sense network 202, and in response to the noise, activate pulse generator 222. When activated, pulse generator 222 can generate a pulse suppression signal SUPP. In one embodiment, pulse generator 222 can be a "one-shot" type pulse generator that outputs pulses that are synchronized to clock signal CLK.

In the particular embodiment shown, a delay section 212 can include a first delay path 224-0 and a second delay path 224-1. In one embodiment, first and second delay paths (224-0 and 224-1) can propagate signal values in synchronism with a signal CLK (and hence in synchronism with TX). In a very particular embodiment, a first delay path 224-0 can delay by 1.5 T (where T is clock cycle of CLK), while a second delay path 224-1 can delay by 1 T. In this way, one delay path (e.g., 224-1) can be conceptualized as sensing a first half of a sense cycle, while the other delay path (e.g., 224-0) can be conceptualized as sensing a second half of the sense cycle.

A switch circuit 214 can be a dual channel multiplexer (MUX) that outputs signals from both delay paths (224-0 and 224-1) when a SUPP signal has one value (corresponding to no noise), and output a reference value (e.g., ground) when a SUPP signal has another value (corresponding to detected noise).

A conversion section 206 can include a sample and hold (S/H) circuit 226 and a converter circuit 228. A S/H circuit 226 can be a differential S/H circuit that stores values from both delay paths (224-0 and 224-1). Such an action can be conceptualized as providing full wave rectification of a sensing period, and can compensate for DC voltage shifts and/or drifts that can occur through delay section 212.

A converter circuit 228 can convert a sampled value into a capacitance output value (DATA). Such a value can be an analog value or a digital value. In the embodiment shown, operation of converter circuit 228 can be controlled by a SUPP signal. In particular, a converter circuit 228 can output values (DATA) based on an interval counter 230. In response to an active signal SUPP, an interval counter 230 can increase an interval count to compensate for sense value(s) discarded due to detected noise. In particular embodiments, a converter circuit 228 can be an analog-to-digital converter (ADC), including but not limited to, an analog integrator type ADC or a sigma-delta modulator type ADC as but two examples.

In this way, a capacitance sense circuit can suppress sensed values and modulate conversion times in response to sensed noise.

Figure 3:
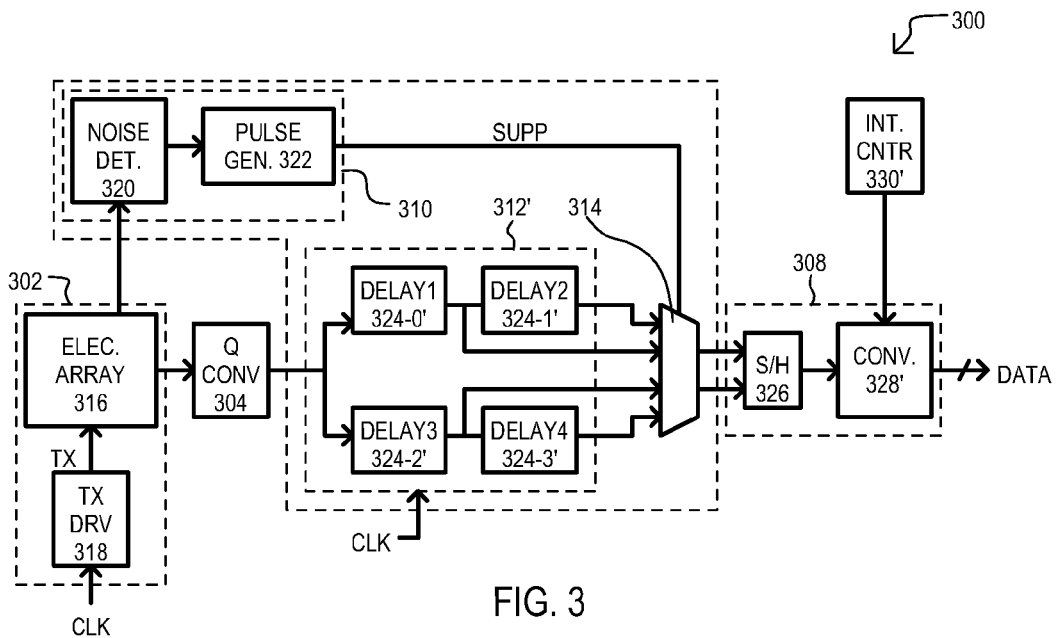
FIG. 3 is a block schematic diagram of a capacitance sensing system having switchable delay noise suppression according to an embodiment.

FIG. 3 shows a capacitance sensing system 300 according to yet another embodiment in a block schematic diagram. In one embodiment, a system 300 can be one particular implementation of that shown in FIG. 1. A system 300 can be considered a "switchable delay" type system, as it selects between different delayed sense signals depending upon detected noise. That is, if noise is detected, a sense signal corresponding to the noise can be prevented from passing through to a converter stage, and a more delayed sense signal can be output to the converter stage in its place.

FIG. 3 shows a capacitance sensing system 300 that can provide constant conversion times, unlike the embodiment of FIG. 2, which may vary a conversion time in the event of a noise event. The embodiment of FIG. 3 can include circuit sections like those of FIG. 2.

The embodiment of FIG. 3 can differ from that of FIG. 2 in that a delay section 312' can provide two sample cycles, delayed with respect to one another. In the event noise is detected, a sense signal containing the noise is not converted, and instead, a delayed version of the signal can be sampled and converted.

In the particular embodiment shown, a delay section 312' can include a first delay path 324-0', second delay path 324-1', third delay path 324-2', and a fourth delay path 324-3'. In one embodiment, delay paths (324-0' to 324-3') can propagate signal values in synchronism with a signal CLK. In a very particular embodiment, a first delay path 324-0' can delay by 1.5 T, a second delay path 324-1' can delay by 2 T, a third delay path 324-2' can delay by 1 T, and a fourth path 324-3' can delay by 2 T. In such an arrangement, in the absence of detected noise, first and second halves of a sense cycle (corresponding to delays of 1 and 1.5 T) can be output to sample and hold circuit 326 (which can be a differential S/H circuit as described above). However, in the event noise is detected, first and second halves of a longer delayed sense cycle (3 and 3.5 T) can be output to sample and hold circuit 326.

A switch circuit 314 can be a dual channel multiplexer (MUX) that outputs signals from both delay paths 324-0' and 324-2' when a SUPP signal has one value (corresponding to no noise), and output signals from delay paths 324-1' and 324-3' when a SUPP signal has another value (corresponding to detected noise).

The embodiment of FIG. 3 can further differ from that of FIG. 2 in that a converter circuit 328' can provide a constant conversion time established by interval counter 330' (the operation of which is not varied in response to the activation of the SUPP signal).

In this way, in the event of detected noise, a capacitance sense circuit can provide a delayed sense signal for conversion to an output value in the place of a sense signal that includes the noise.

Figure 4:
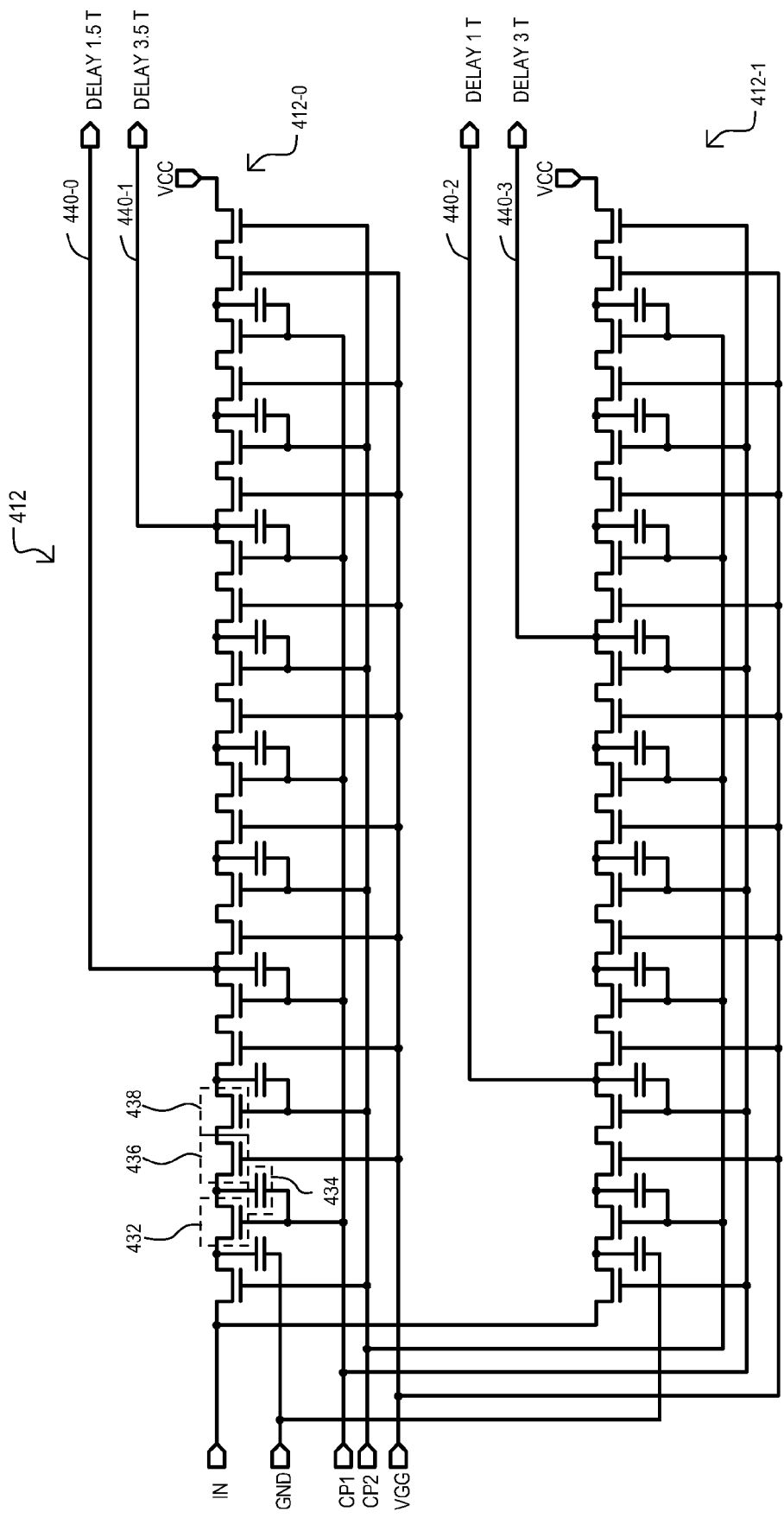
FIG. 4 is a schematic diagram of a delay section that can be included in embodiments.

FIG. 4 shows one example of a delay section 412 that can be included in embodiments shown herein. A delay section 412 can be a switching capacitor type delay line. In the embodiment shown, a delay section 412 can include parallel switching capacitor delay lines 412-0 and 412-1, each of which can include first devices (one shown as 432), capacitors (one shown as 434), gain devices (one shown as 436), and second devices (one show as 438) arranged in series with one another.

First devices (e.g., 432) can pass an input signal from a previous stage in response to a first clock signal CP1. In one embodiment, a signal CP1 can be synchronous with a timing signal used to generate a transmit signal (TX) that drives electrodes in a sense network. In the embodiment shown, first devices (e.g., 432) can be n-channel transistors. A capacitor (e.g., 434) can be connected between control terminals and signal paths (i.e., between a source and gate) of each first and second device. Gain devices (e.g., 436) can amplify and/or prevent losses in an input value as it is propagates along the delay line. In the embodiment shown, gain devices (e.g., 436) can be n-channel transistors with a gate that receives a bias voltage (VGG). Second devices (e.g., 438) can pass an input signal from a previous stage in response to a second clock signal CP2. A signal CP2 can be synchronous to and non-overlapping with signal CP1 (that is, CP2 is not active while CP1 is active, and CP1 is not active when CP2 is active). In the embodiment shown, second devices (e.g., 438) can be n-channel transistors.

Different delays in a signal can be provided by tapping at different locations along the delay line. FIG. 4 shows four tap locations 440-0, 440-1, 440-2 and 440-3, providing delays of 1.5 T, 3.5 T, 1 T and 3 T (where T is a sensing clock cycle), respectively. In an embodiment like that of FIG. 2, only two tap locations (e.g., 440-0 and 440-2) can be used. However, in an embodiment like that of FIG. 3, all four tap locations (440-0 to 440-3) can be used.

As noted above, providing taps from consecutive half cycles (e.g., 1/1.5 T, 3/3.5 T) to a differential sample and hold circuit can provide full wave rectification of a sense cycle.

Figure 5:
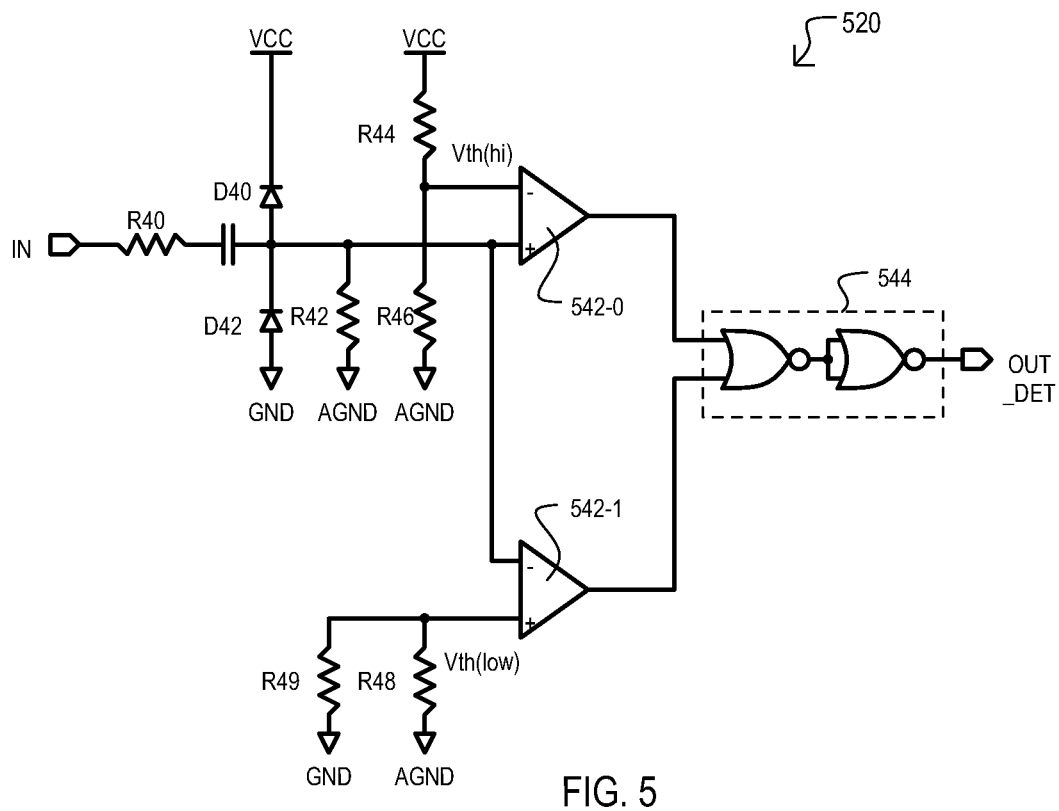
FIG. 5 is a schematic diagram of a noise detect circuit that can be included in embodiments.

FIG. 5 shows one example of a noise detection circuit 520 that can be included in embodiments shown herein. A noise detection circuit 520 can sense noise of different polarities according to a magnitude of an input signal. That is, an input signal is expected, absent the effect of noise, to remain below a high threshold voltage, and not fall below a low threshold voltage. In the embodiment shown, a noise detection circuit 520 can include a first comparator 542-0, a second comparator 542-1, and output logic 544.

A first comparator 542-0 can have a (−) input connected to receive a high threshold voltage, a (+) input connected to receive an input signal (IN). Thus, if an input signal rises above a high threshold voltage, an output of first comparator 542-0 can be driven from low-to-high. In the embodiment shown, a high threshold voltage can be established by a voltage divider formed from resistors R44 and R46 formed between a high supply voltage VCC and an analog ground voltage (AGND).

A second comparator 542-1 can have a (−) input connected to receive input signal (IN), and a (+) input connected to receive a low threshold voltage, which in this case can be a voltage slightly lower than AGND, formed by resistor R48 connected to GND in parallel with resistor R49 connected to analog ground AGND. Thus, if an input signal falls below a low voltage (GND in this case) an output of second comparator 542-1 can be driven from low-to-high. FIG. 5 also shows an input protection resistor R40, and input protection diodes D40 and D42.

In the embodiment shown, output logic 544 can be an OR type circuit. Consequently, if either a high or low going noise pulse is detected, the output signal OUT_DET will be driven high.

Figure 6:
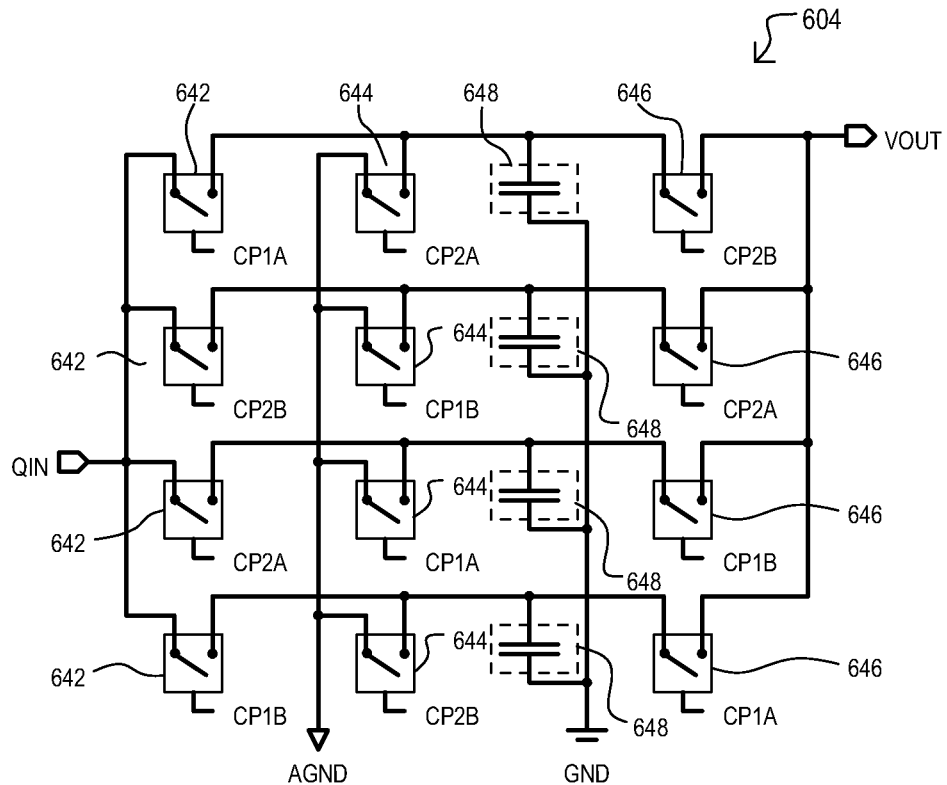
FIG. 6 is a schematic diagram of a charge-to-voltage sense signal generator that can be included in embodiments.

FIG. 6 shows one example of a sense signal generator 604 that can be included in embodiments shown herein. A sense signal generator 604 can be a charge-to-voltage (Q-to-V) converter. An input charge (QIN) can be received at an input. Such a charge can be a charge induced on a receive electrode by mutual capacitance with a transmit electrode. Sense signal generator 604 can create an output voltage VOUT from such an input charge.

In the embodiment shown, a sense signal generator 604 can include input switches 642, reset switches 644, output switches 646, and capture capacitors 648. Reset switches 644 can connect an input charge QIN to a corresponding storage capacitor 648. Each input switch 642 is enabled according to different clock signals: CP1A, CP2B, CP2A, and CP1B. CP1A is non-overlapping with CP2A. CP1B is non-overlapping with CP2B. An order of activation for such clocks can be CP1A, CP2B, CP2A, CP1B (and repeat).

Reset switches 644 can discharge capture capacitors 648, to enable such capacitors to store a next acquired charge values. Like input switches 642, reset switches 644 are enabled by different ones of the clock signals.

Output switches 646 can output a voltage created by charging capture capacitors 648 as VOUT. Output switches 646 are enabled by different ones of the clock signals.

Figure 7:
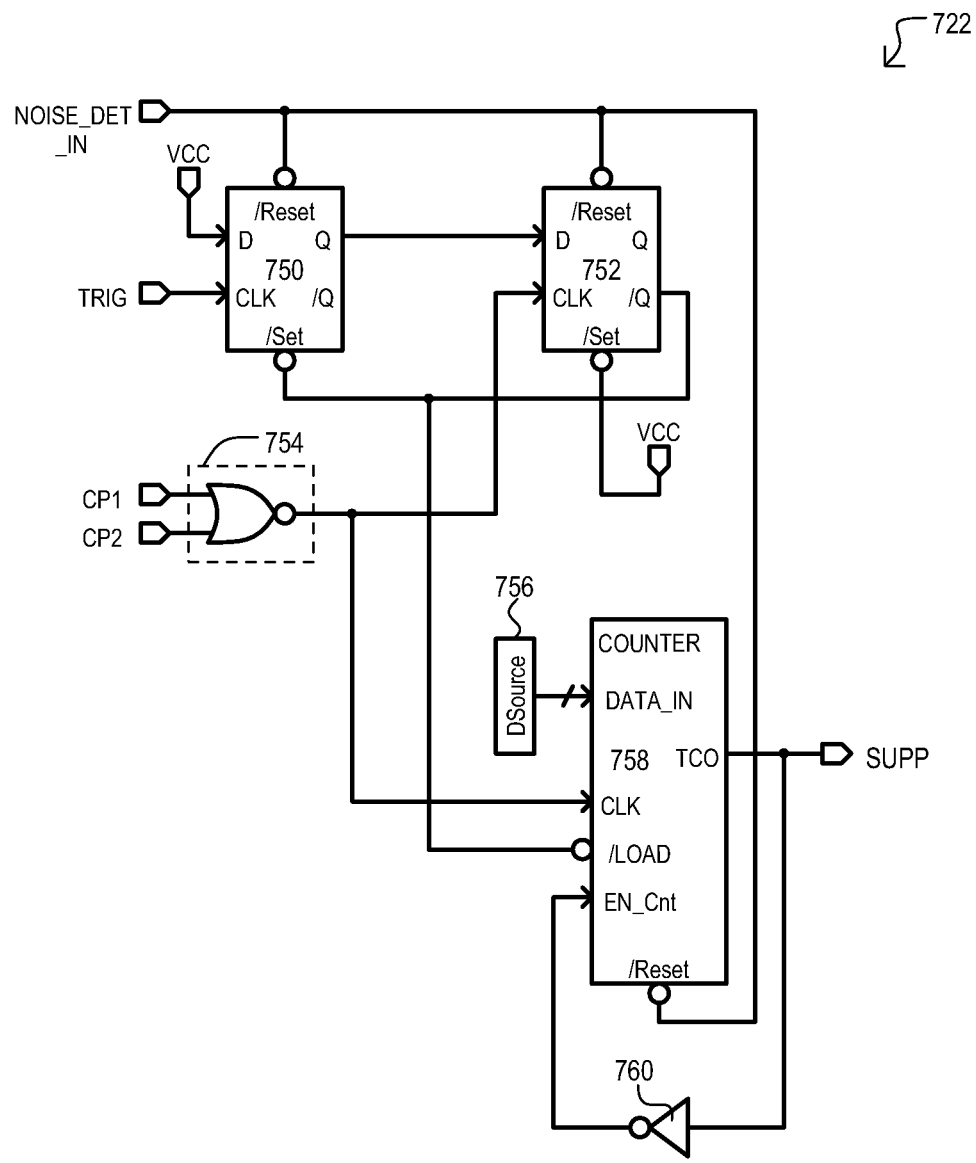
FIG. 7 is a block schematic diagram of a synchronous pulse generator circuit that can be included in embodiments.

FIG. 7 shows one example of a pulse generator 722 that can be included in embodiments shown herein. A pulse generator 722 can be a synchronous "one-shot" circuit that outputs of pulse of predetermined duration in response to a noise detection pulse (such as that output from the circuit of FIG. 5). Such a pulse can be synchronous with sense signals output from a delay section (e.g., any of 112, 212, 312' of FIGS. 1, 2 and 3, respectively), to thereby enable any noisy sense signals to be suppressed or substituted before being converted into output values.

While a pulse generator 722 can take various forms, the particular circuit shown in FIG. 7 can include a first D-type flip-flop (FF) 750, a second D-type FF 752, clock capture logic 754, a pulse duration counter 758, a pulse duration value source 756, and an inverter 760.

In response to a noise detection pulse (NOISE_DET_IN high), indicating that noise has been detected on a sense network, first D-type FF 750 can activate its output (Q). In response to an active output from first D-type FF 750, second D-type FF 752 can activate its output (/Q) synchronous with its clock input (CLK). By operation of clock capture logic 754, second D-type FF 752 can activate its output in response to either of clocks CP1 or CP2.

In response to second D-type FF 752 activating its output (/Q), pulse duration counter 758 can load a count duration from pulse duration value source 756 and start counting. While counter 758 counts, output TCO can be active, generating a pulse in output signal SUPP. Inverter 760 can enable and disable counter operations in response to output signal SUPP.

First and second D-type FFs (750 and 752) as well as counter 758 can be reset by an initialization signal INIT.

Figure 8:
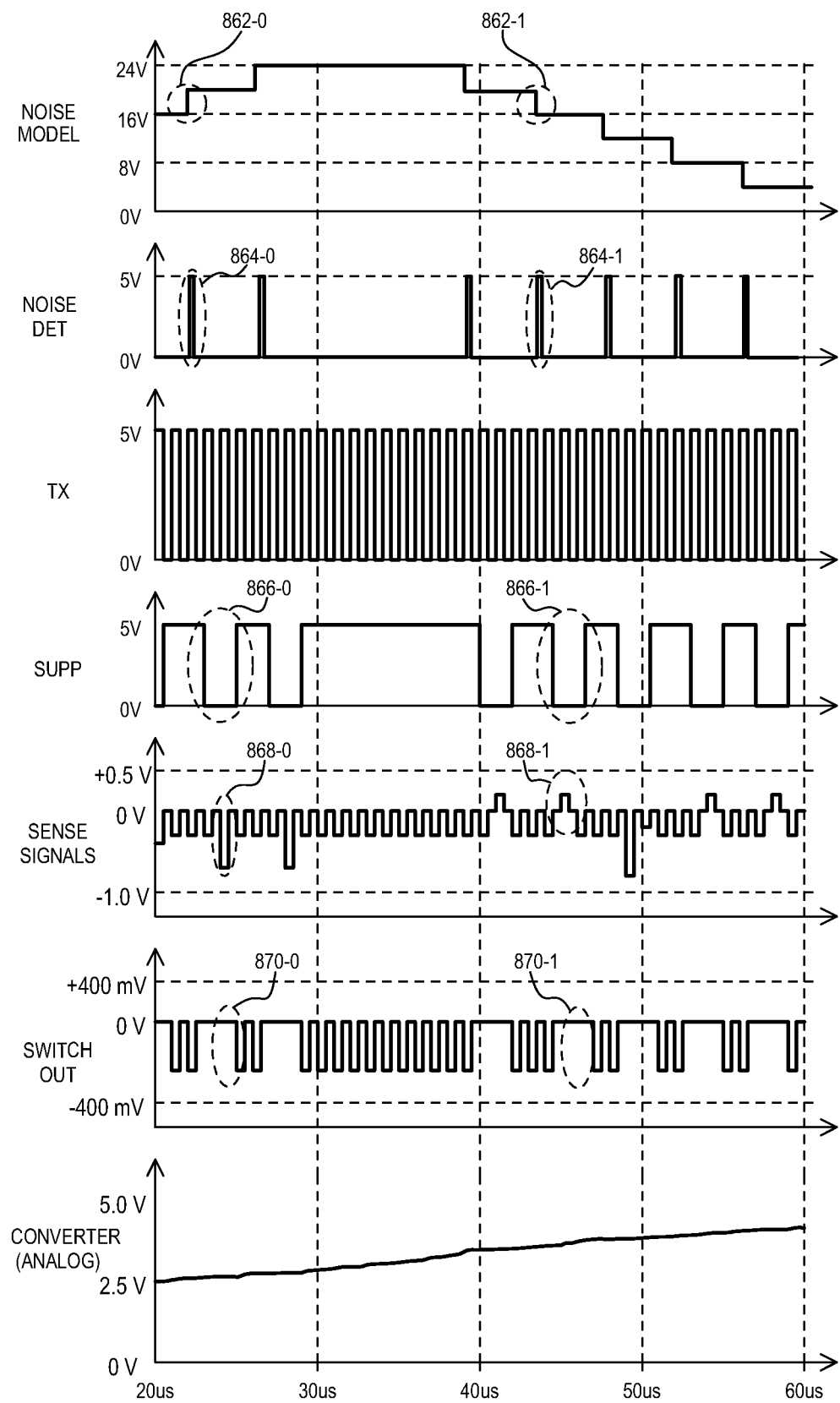
FIG. 8 is timing diagram showing a gated conversion noise suppression operation according to one embodiment.

FIG. 8 is a timing diagram showing simulation results for a gated conversion type system, like that of FIG. 2, implemented with circuits shown in FIGS. 4 to 7. FIG. 8 includes the following waveforms: NOISE MODEL, which shows a noise signal applied to a sense network to induce noise events; NOISE DET, which shows a noise detection signal, like that output from the noise detection circuit of FIG. 5; TX, which shows a transmit signal applied to TX electrodes in a sense network to generate sense signals on RX electrodes; SUPP, which shows a synchronized suppression pulse generated by a synchronized pulse generator like that shown in FIG. 7; SENSE SIGNALS, which show sense signals output from a signal generator like that shown in FIG. 6; SWITCH OUT, which shows signals output from a switch circuit that grounds sense signals in response to suppression pulse SUPP; and CONVERTER, which shows an analog voltage generated in response to receiving the SWITCH OUT signal. It is understood that while waveform CONVERTER is an analog value, such a value can also be converted to a digital value within a converter.

Noise suppression operations will now be described with reference to FIG. 8.

As shown by waveform NOISE MODEL, an applied noise inducing signal can have high-going transitions (one shown as 862-0). In response to such a transition, a noise event (e.g., low-going spike) can be induced within a sense network. As shown by waveform SENSE SIGNALS, noise caused by high-going transition 862-0 of the noise inducing waveform can result in a "noisy" sense signal 868-0, which in the example shown, is driven low by the simulated noise.

As shown by waveform NOISE DET, in response to simulated noise caused by transition 862-0, a noise detection circuit (e.g., FIG. 5) can generate a noise detection pulse 864-0. As shown by waveform SUPP, in response to the noise detection pulse 864-0, a pulse generator (e.g., FIG. 7) can generate a suppression pulse 866-0.

As shown by waveform SWITCH OUT, in response to suppression pulse 866-0, sense values output from a switch circuit can be grounded (driven to 0 V), ensuring the noisy sense signal 868-0 is not supplied to a converter (i.e., is prevented from being sensed).

As also shown by waveform NOISE MODEL, an applied noise inducing signal can also have low-going transitions (one shown as 862-1). In response to such a transition, a noise event (e.g., high-going spike) can be induced within a sense network. As shown by waveform SENSE SIGNALS, noise caused by low-going transition 862-1 can result in a "noisy" sense signal 868-1, which in the example shown, is driven high by the simulated noise.

As shown by waveform NOISE DET, in response to transition 862-1, a noise detection circuit can generate a noise detection pulse 864-1, which results in a suppression pulse 866-1. In response to suppression pulse 866-1, noisy sense signal 868-1 is prevented from being sensed in the same fashion as previously described noisy sense signal 868-0.

FIG. 9 is table of simulation results corresponding to the gated conversion type system shown in FIG. 8. FIG. 9 shows a conversion result without simulated noise (10.275 V). A conversion result with noise suppression disabled has a peak-to-peak variation of 266 mV, representing a 2.16% variation from a nominal value. A conversion result with noise suppression enabled has a peak-to-peak variation of 42 mV, representing a 0.4% variation from a nominal value.

FIG. 10 is another table of simulation results corresponding to FIG. 8. As will be recalled, a gated conversion type system can vary a conversion time in the event noise is detected. FIG. 10 shows conversion times resulting from scaling a noise period. Column "Period down scaling factor" shows a scaling down factor, with the "1" case corresponding to the FIG. 8 NOISE MODEL. Column "Minimum Noise interval" shows a resulting minimum time between simulated noise events. Column "Converted Value" shows a resulting value obtained by a converter. Column "Conversion time" shows an increase in conversion time resulting from noise suppression.

Figure 11:
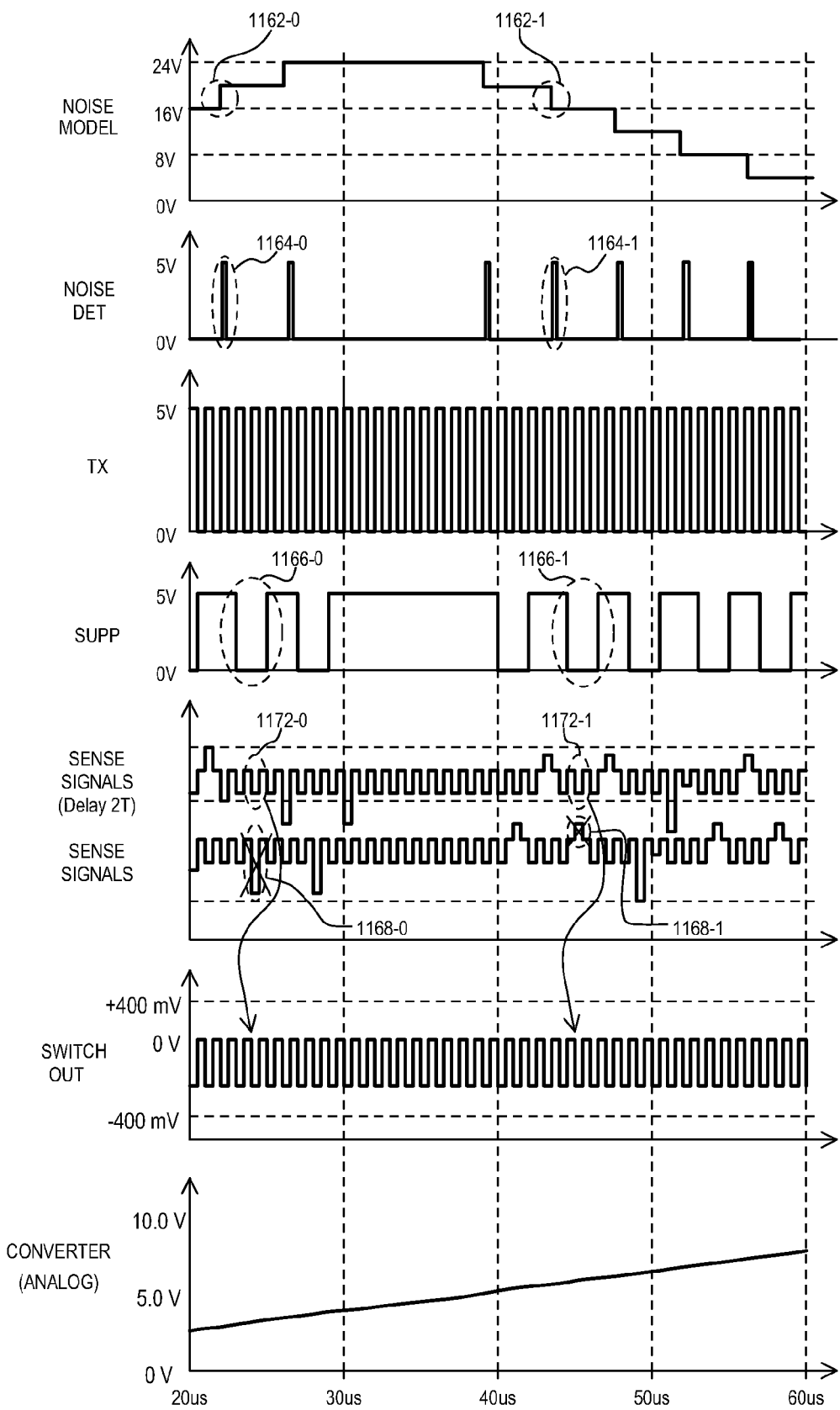
FIG. 11 is timing diagram showing a switchable delay noise suppression operation according to one embodiment.

FIG. 11 is a timing diagram showing simulation results for a switchable delay type system, like that of FIG. 3, implemented with circuits shown in FIGS. 4 to 7. FIG. 11 includes the same waveforms as FIG. 8, and like waveforms have the same labels.

FIG. 11 differs from FIG. 8 in that it includes, in addition to SENSE SIGNALS, a waveform SENSE SIGNALS (Delay 2T) which corresponds to the same signals as SENSE SIGNALS, but delayed by two periods of the TX clock signal.

Noise suppression operations will now be described with reference to FIG. 11.

As in the case of FIG. 8, an applied noise inducing signal can have a high-going transitions 1162-0 and low-going transitions 1162-1 which result in SENSE SIGNALS having "noisy" sense signals 1168-0 and 1168-1. Further, in response to simulated noise, a noise detection circuit (e.g., FIG. 5) can generate noise detection pulses (e.g., 1164-0 and 1164-1) which trigger noise suppression pulses 1166-0 and 1166-1.

Unlike the operation of FIG. 8, in response to noise suppression pulses (e.g., 1166-0 and 1166-1), a switch circuit can provide delayed replacement sense signals 1172-0 and 1172-1, in place of noisy sense signals (1168-0 and 1168-1). As shown by waveform SWITCH OUT, replacing noisy signals with delayed replacement signals can prevent noisy signals from being sensed.

FIG. 12 is table of simulation results corresponding to the switchable delay type system shown in FIG. 11. FIG. 12 presents conversion results in the same manner as FIG. 9. As shown, with noise suppression disabled, a conversion result has a peak-to-peak variation of 457 mV, representing a 2.52% variation from a nominal value. A conversion result with noise suppression enabled has a peak-to-peak variation of 38 mV, representing a 0.2% variation from a nominal value.

FIG. 13 is another table of simulation results corresponding to the switchable delay type system shown in FIG. 11. FIG. 13 presents conversion results in the same manner as FIG. 10. In contrast to FIG. 10, FIG. 13 can provide constant conversion times over reductions in a minimum time between simulated noise events.

Figure 15:
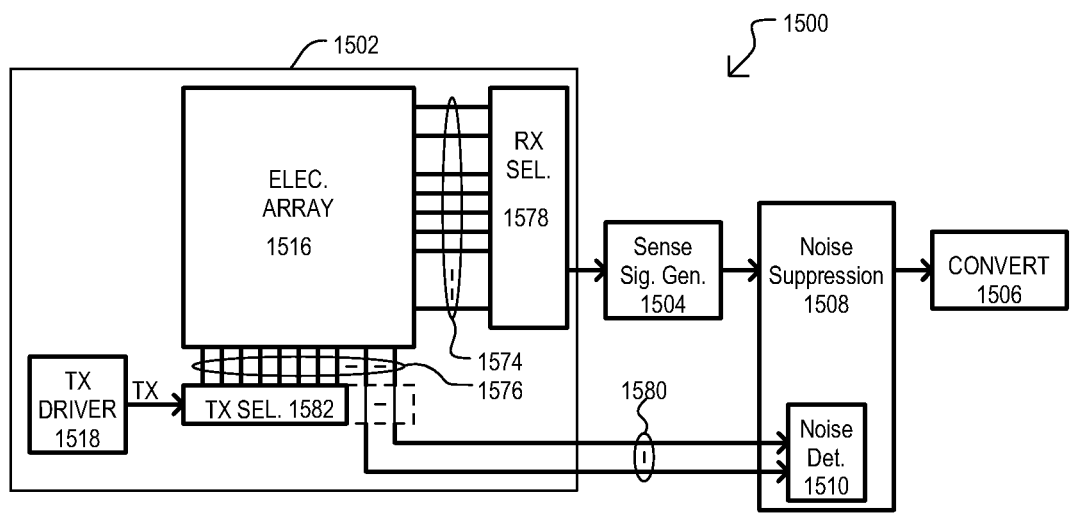
FIG. 15 is a block schematic diagram of a capacitance sensing circuit with noise suppression that detects noise on one or more transmit electrodes according to an embodiment.
Figure 16:
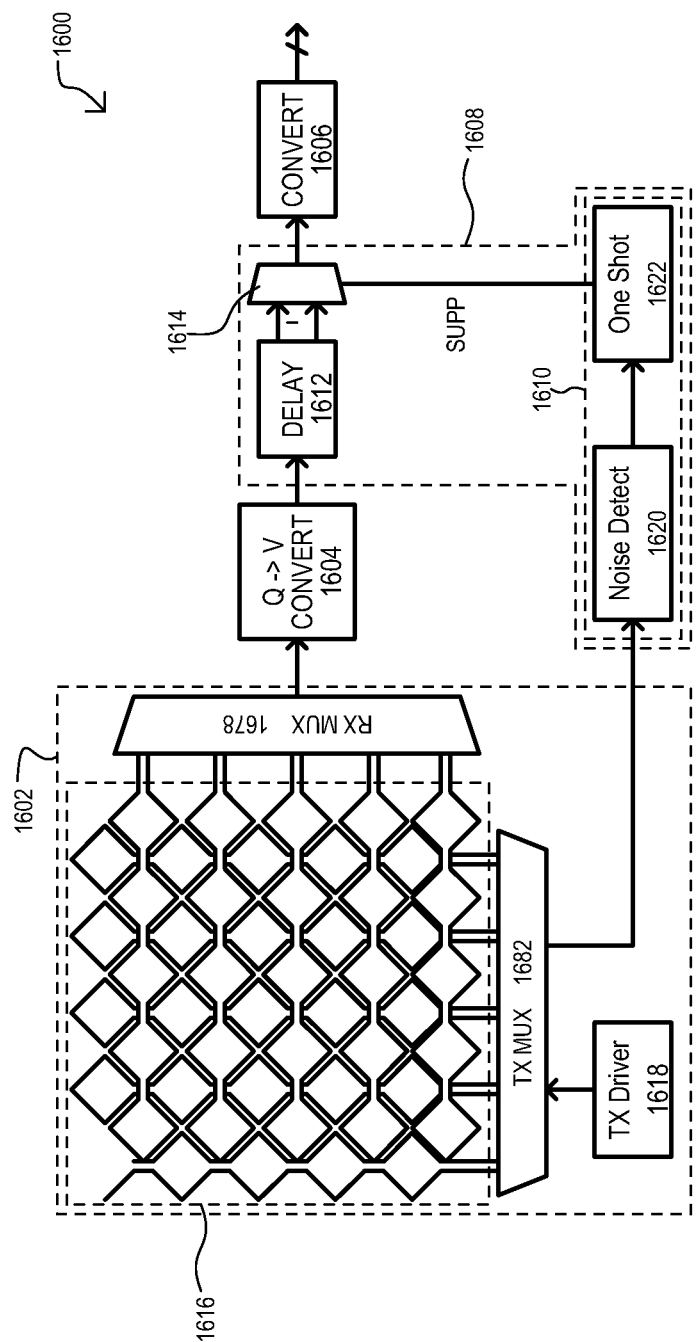
FIG. 16 is a block schematic diagram of a capacitance sensing circuit with noise suppression that detects noise on a non-driven transmit electrode according to an embodiment.

Embodiments above have shown capacitance sensing systems that can detect noise present in a sense network, and suppress signals that are adversely affected by such noise. Examples of noise detection configurations according to very particular embodiments are shown in FIGS. 14 to 16.

Figure 14:
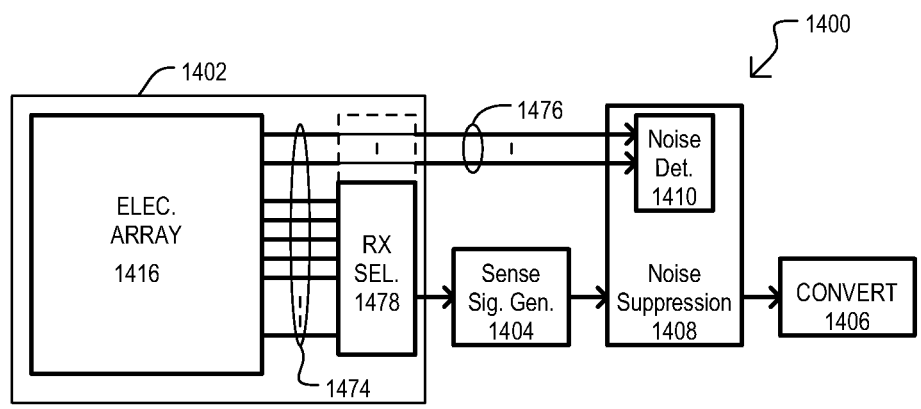
FIG. 14 is a block schematic diagram of a capacitance sensing circuit with noise suppression that detects noise on one or more receive electrodes according to an embodiment.

FIG. 14 shows a capacitance sensing system 1400 according to one embodiment. System 1400 shows an arrangement in which one or more RX electrodes can be used to sense noise in a capacitance sense network 1402.

In the embodiment shown, a sense network 1402 can include an electrode array 1416 that includes RX electrodes 1474 and an RX electrode selector 1478. A capacitance related to RX electrodes 1474 can vary in response to the proximity of an object to the electrode array 1416. RX electrode selector 1478 can connect one or more of RX electrodes to a sense signal generator 1404.

RX electrodes 1474 can include one or more sense RX electrodes 1476, which can be connected to a noise detection section 1410. Sense RX electrode(s) 1476 can be dedicated sense structures that are not used in a sensing operation (i.e., are not connected to sense signal generator 1404), or alternatively, can be RX electrodes that a sensed for noise while one or more other RX electrodes are sensed for capacitance changes.

In response to noise sensed on sense RX electrode(s) 1476 by noise detection section 1410, noise suppression section 1408 can suppress noise on sense signals provided to a converter 1406 as described herein, or equivalents.

FIG. 15 shows a capacitance sensing system 1500 according to another embodiment. System 1500 shows an arrangement in which one or more TX electrodes can be used to sense noise in a capacitance sense network 1502.

In the embodiment shown, a sense network 1502 can include an electrode array 1516 that includes a TX driver 1518 that drives one or more TX electrodes 1576 with a TX signal based on a TX electrode selector 1582. A sense network 1502 can also include RX electrodes 1574 and an RX electrode selector 1578.

TX electrodes 1576 can include one or more sense TX electrodes 1580, which can be connected to a noise detection section 1510. Sense TX electrode(s) 1580 can be dedicated sense structures that are not used in a sensing operation (i.e., are not driven by signal TX), or alternatively, can be TX electrode(s) that are currently not being driven with signal TX.

In response to noise sensed on sense TX electrode(s) 1580 by noise detection section 1510, noise suppression section 1508 can suppress noise on sense signals provided to a converter 1506 as described herein, or equivalents.

FIG. 16 shows a capacitance sensing system 1600 according to another embodiment. In one embodiment, a system 1600 can be one particular implementation of that shown in FIG. 14. A system 1600 can sense noise using a non-driven TX electrode.

In the embodiment shown, a sense network 1602 can include an electrode array 1616, a TX MUX 1682, a TX driver 1618, and an RX MUX 1678. A TX MUX 1682 can select a TX electrode to be driven by TX driver 1618, and enable a non-driven TX electrode to be connected to a noise detect section 1610.

An RX MUX 1678 can connect an RX electrode of electrode array 1616 to a sense signal generator 1604, which in the embodiment shown can be a charge-to-voltage converter. A delay section 1612, switch circuit 1614 and conversion section 1606 can operate as described in embodiments above, or equivalents.

Figure 17:
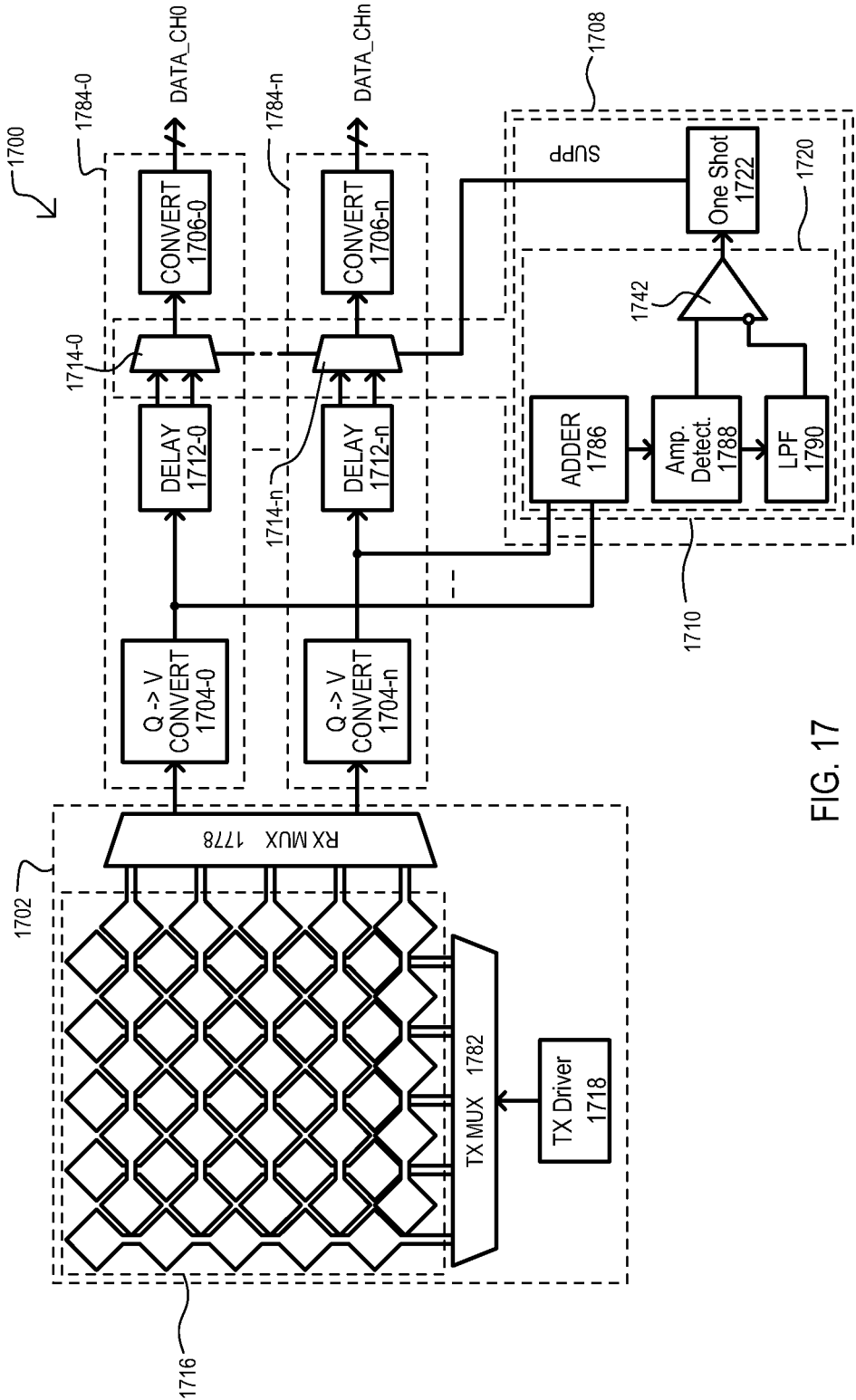
FIG. 17 is a block schematic diagram of a capacitance sensing circuit with noise suppression that detects noise on multiple sense channels according to an embodiment.

FIG. 17 shows a capacitance sensing system 1700 according to yet another embodiment. A system 1700 can differ from embodiments like that of FIGS. 1-3 and 14-16 in that it may detect noise by monitoring signals generated by signal generator circuits connected to a sense network, as opposed to monitoring one or more electrodes of the sense network. The particular embodiment shown can provide noise suppression across multiple channels by monitoring for noise on all such channels.

A system 1700 can include a sense network 1702 like that of FIG. 16, however, a TX MUX 1782 does not provide a path to a TX electrode for noise sensing. Further, RX MUX 1778 can connect RX electrodes to multiple channels (1784-0 to 1784-*n*). Each different channel (1784-0 to 1784-*n*) can provide its own capacitance sense result (DATA_CH0 to DATA_CHn). In the embodiment shown, each channel (1784-0 to 1784-*n*) can include a sense signal generator (1704-0 to 1704-*n*) (in this case a Q-to-V converter), a delay section (1712-0 to 1712-*n*), a switch circuit (1714-0 to 1714-*n*), and a conversion section (1706-0 to 1706-*n*).

A system 1700 also includes a noise suppression section 1708 that can include a noise detection section 1710 and switch circuits (1714-0 to 1714-*n*). A noise detection section 1710 can sense noise by monitoring signals received on multiple channels (1784-0 to 1784-*n*). A noise detection section 1710 can include a noise detection circuit 1720 and a pulse generator 1722 (which in this embodiment can be a synchronous one-shot as described above). A pulse generator 1722 can operate in conjunction with switch circuits (1714-0 to 1714-*n*) to suppress noise along channels (1784-0 to 1784-*n*) as described herein, or equivalents.

A noise detection circuit 1720 can detect noise by summing sense signals on multiple channels (1784-0 to 1784-*n*). In the embodiment shown, noise detection circuit 1720 can include a signal adder 1786, a detect amplifier 1788, a low pass filter (LPF) 1790, and a comparator 1742.

In operation, a signal adder 1786 can combine sense signals from multiple, parallel channels. Detect amplifier 1788 can amplify a signal generated by signal adder 1786. Such an amplified signal can be provided to a first (+) input of comparator 1742, and also to LPF 1790. LPF 1790 can filter the amplified signal, and provide such a filtered value to a second (−) input of comparator 1742. Consequently, a higher frequency (relative to the pass band of LPF) noise event can result in a noise detection pulse being generated by comparator 1742. In response to such a noise detection pulse, noise suppression can take place along all channels (1784-0 to 1784-*n*) by operation of pulse generator 1722 and switch circuits (1714-0 to 1714-*n*). Such noise suppression can include, but is not limited to, gated conversion techniques and/or switchable delay techniques described herein, or equivalents.

In one embodiment, sense signal generators (1704-0 to 1704-*n*) can provide sense signals in response to, and synchronous with, a TX signal from TX driver 1718. Thus, a noise detection circuit 1720 can provide a cycle-by-cycle monitoring of sense signals for noise.

Figure 18:
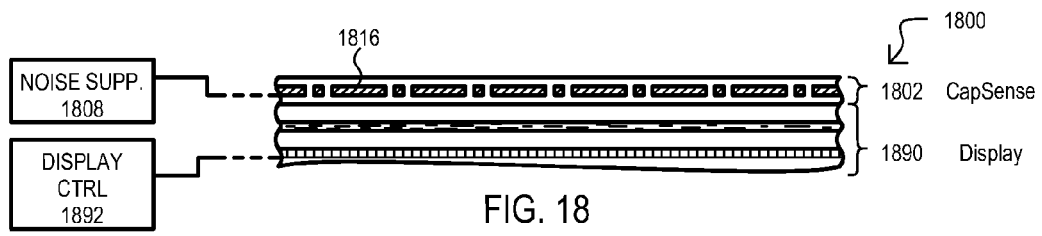
FIG. 18 is a block schematic diagram of a capacitance sensing circuit with noise suppression having a sense network physically connected to a display device that can be a source of noise.

The various embodiments described herein can suppress noise arising on a capacitance sense network that originates from any of a number of sources. In particular embodiments, noise suppression can be directed to noise created from a display device that is physically connected to the capacitance sense network. FIG. 18 is one particular embodiment showing such a configuration.

FIG. 18 shows a capacitance system 1800 according to one embodiment. System 1800 can include a capacitance sensing network 1802, a display device 1890, a noise suppression section 1808, and a display controller 1892. A capacitance sensing network 1802 can include transparent electrodes (one shown as 1816), and can be formed over, and physically attached to, the display device 1890. A display device 1890 can include any suitable display device, but in particular embodiments, can include a liquid crystal display (LCD), light emitting diode (LED) display, organic LED (OLED) display, to name but a few.

A display controller 1892 can generate electrical signals for controlling display device 1890, and such electrical signals may create noise for the capacitance sensing network 1802. A noise suppression section 1808 can suppress noise created by display controller/device 1892/1890 according to the techniques described herein or equivalents.

As will be recalled, the embodiment of FIG. 17 showed a capacitance sensing system in which sense signals generated from a sense network can be monitored for noise. Additional embodiments utilizing such techniques will now be described with reference to FIGS. 19-22.

Figure 19:
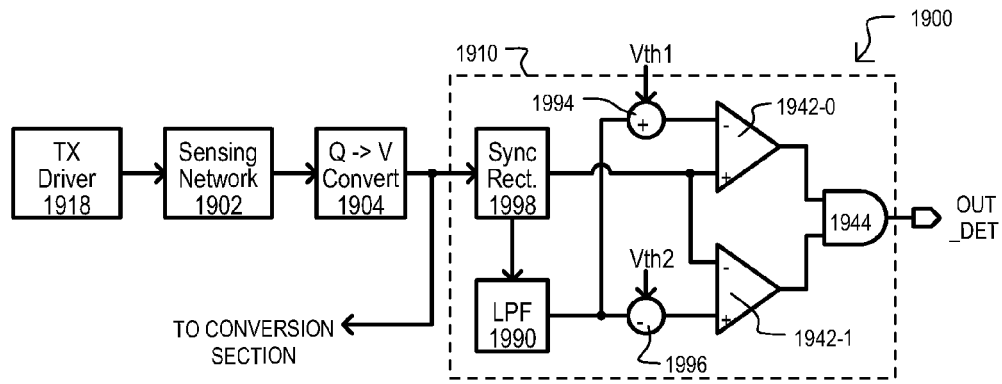
FIG. 19 is a block schematic diagram of a capacitance sense system having noise detection based on averaging cycles of a period sense signal.

FIG. 19 shows a capacitance sensing system 1900 according to another embodiment. A system 1900 can provide cycle-by-cycle monitoring of periodic sense signals. A system 1900 can include a TX driver 1918, a sense network 1902, a sense signal generator 1904, and a noise detection section 1910. A TX driver 1918 can drive a sense network 1902 with a periodic signal to induce charge variations that can vary according to a mutual capacitance. Sense signal generator 1904 can be a Q-to-V converter that can provide a periodic voltage signal to noise detection section 1910 and to a conversion section (not shown), either directly or via intervening circuits.

In the embodiment shown, a noise detection section 1910 can include a synchronous rectifier 1998, a LPF 1990, a high threshold voltage offset 1994, a low threshold voltage offset 1996, a first comparator 1942-0, a second comparator 1942-1, and output logic 1944. A synchronous rectifier 1998 can rectify a periodic sense voltage signals received from sense signal generator 1904. The rectified signal can be provided to a (+) input of first comparator 1942-0 and a (−) input of second comparator 1942-1. LPF 1990 can filter the rectified signal to generate an average signal voltage level. A high threshold voltage offset 1994 can add a voltage to the average level and provide such a value to the (−) input of first comparator 1942-0. Similarly, a low threshold voltage offset 1996 can subtract a voltage from the average level and provide such a value to the (+) input of second comparator 1942-1. Output logic 1944 can logically OR outputs from both comparators 1942-0/1.

Accordingly, a noise detect signal (OUT_DET) can be activated when an output from synchronous rectifier 1998 falls below the average level (minus the low threshold offset) or rises above the average level (plus the high threshold offset).

Figure 20:
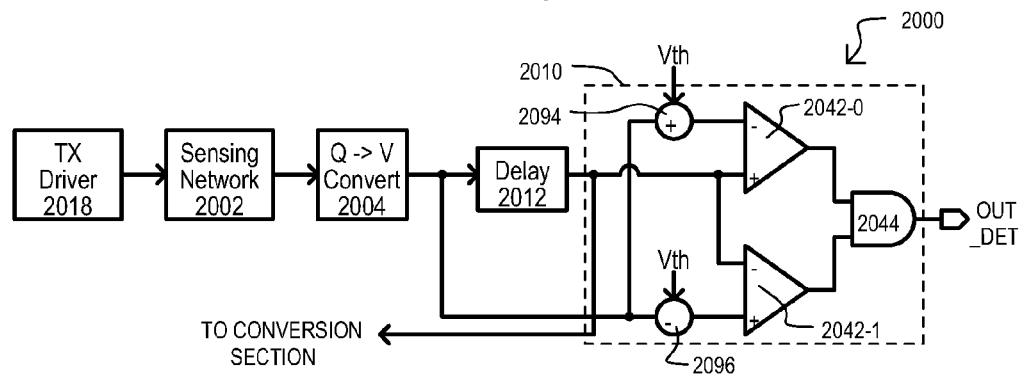
FIG. 20 is a block schematic diagram of a capacitance sense system having noise detection based on comparing cycles of a period sense signal.

FIG. 20 shows a capacitance sensing system 2000 according to a further embodiment. A system 2000 can also provide cycle-by-cycle monitoring of periodic sense signals. However, system 2000 can operate by comparing a sequence of sense signals with a delayed version of the same sequence of sense signals.

The system 2000 can include sections like those of FIG. 19.

System 2000 can differ from FIG. 19 in that it can include a delay section 2012 that can delay periodic sense signal sequence. In one embodiment, such a delay can be one cycle (i.e., 1T).

A system 2000 can also differ from that of FIG. 19 in that a noise detection section 2010 does not include a synchronous rectifier or LPF. Instead, a delayed sense signal (output from delay section 2012) can be provided to a (+) input of first comparator 2042-0 and a (−) input of second comparator 2042-1. A non-delayed (or less delayed) sense signal (input to delay section 2012) can be provided to a (−) input of first comparator 2042-0 and a (+) input of second comparator 2042-1.

Accordingly, a noise detect signal (OUT_DET) can be activated when a sense signal exceeds a delayed version of a same sense signal sequence by a high or low threshold offset.

Figure 21:
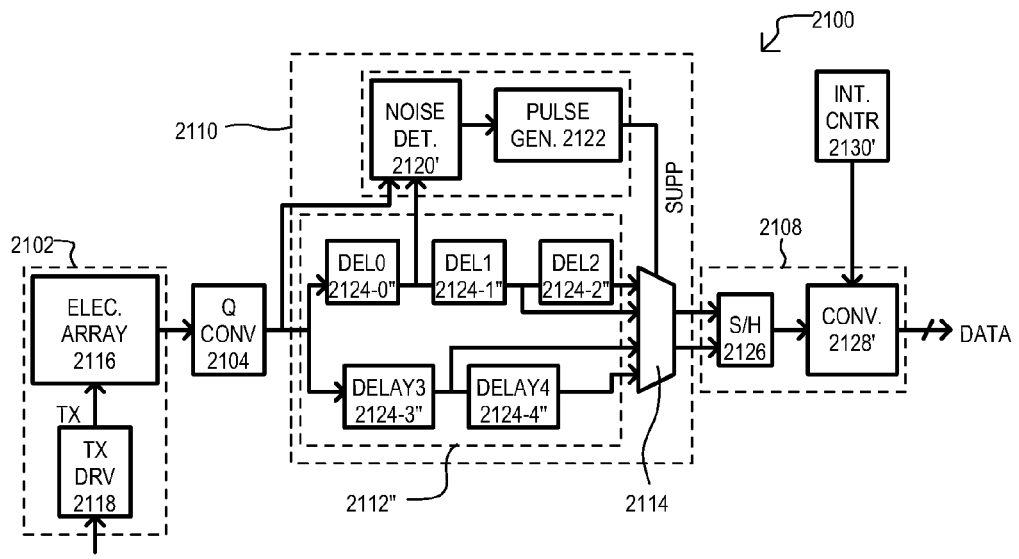
FIG. 21 is a block schematic diagram of a capacitance sense system having noise detection based on a period sense signal and corresponding noise suppression.

FIG. 21 shows a capacitance sensing system 2100 according to yet another embodiment in a block schematic diagram. In one embodiment, a system 2100 can be one particular implementation of that shown in FIG. 20. A system 2100 can be considered a "switchable delay" type system, as it selects between different delayed sense signals depending upon detected noise. The embodiment of FIG. 21 can include circuit sections like those of FIG. 3.

The embodiment of FIG. 21 can differ from that of FIG. 3 in that a delay section 2112" can include five delay sections 2124-0" to 2124-4". An output of first delay path 2124-0" can be provided to a noise detection circuit 2120'. Noise detection circuit 2120' can also receive a non-delayed signal (i.e., output from sense signal generator 2104) as an input.

In one embodiment, a noise detection circuit 2120' can take the form of that shown as 2010 in FIG. 20.

In this way, a generated signals on a capacitance receive channel can be monitored for noise, and if noise is sensed, it can be suppressed by a switching circuit that receives a delay version of the sense signals.

Figure 22:
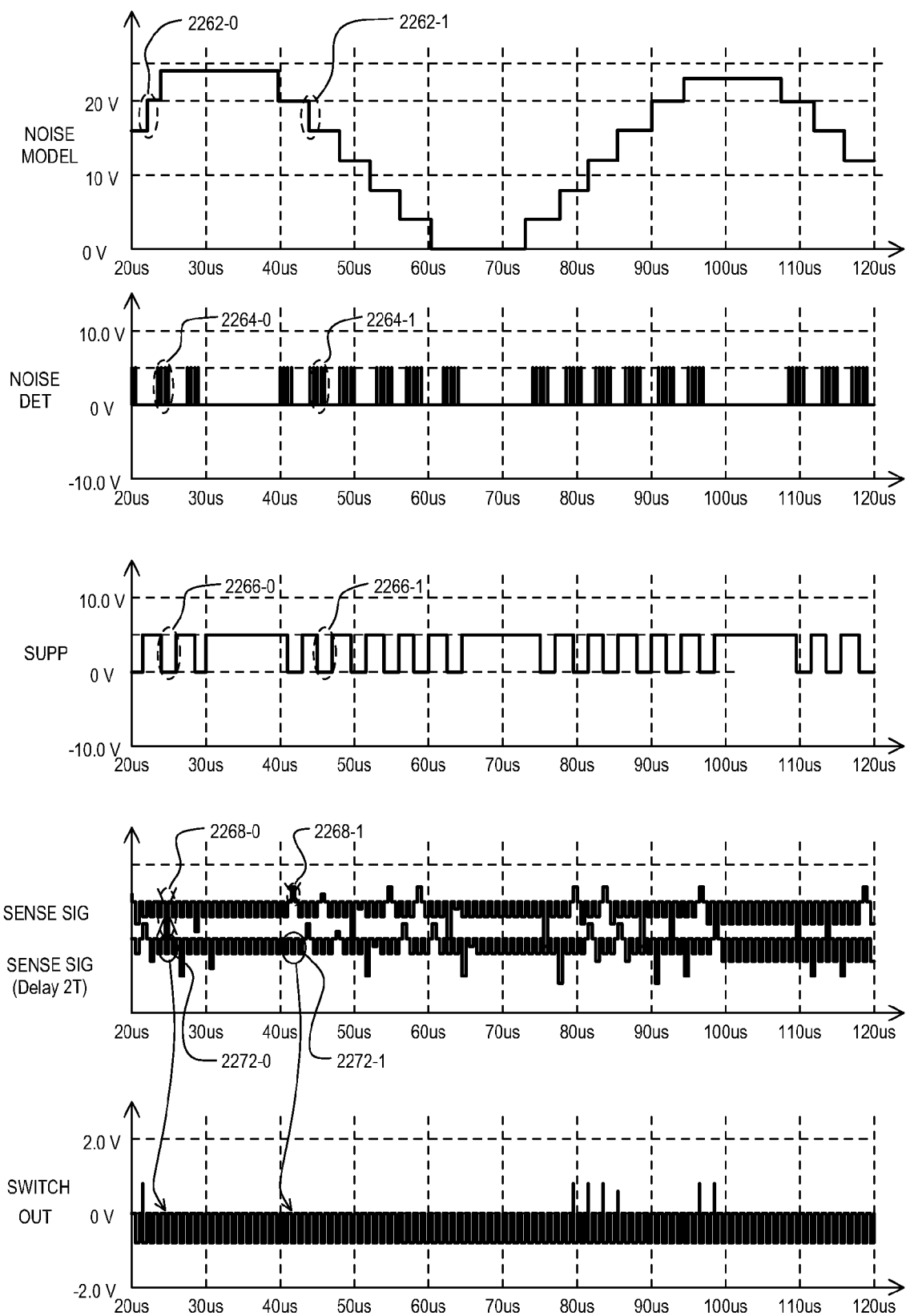
FIG. 22 is timing diagram showing a switchable delay noise suppression operation according to another embodiment.

FIG. 22 is a timing diagram showing simulation results for a switchable delay type system, like that of FIG. 21, implemented with circuits shown in FIGS. 6-7, 20 and 23 (shown below). FIG. 22 includes some of the same waveforms as FIG. 11, and like waveforms have the same labels. FIG. 22 does not include a TX waveform, however.

Noise suppression operations will now be described with reference to FIG. 22.

As in the case of FIG. 11, an applied noise inducing signal can have high-going transitions (e.g., 2262-0) and low-going transitions (e.g., 2262-1), which result in SENSE SIGNALS having "noisy" sense signals 2268-0 and 2268-1. Further, in response to simulated noise, a noise detection circuit (e.g., 2010 in FIG. 20) can generate noise detection pulses (e.g., 2264-0 and 2264-1 in NOISE DET) which trigger noise suppression pulses 2266-0 and 2266-1.

Like the operation of FIG. 11, in response to noise suppression pulses (e.g., 2266-0 and 2266-1), a switch circuit can provide delayed replacement sense signals 2272-0 and 2272-1, in place of noisy sense signals (2268-0 and 2268-1). As shown by waveform SWITCH OUT, replacing noisy signals with delayed replacement signals can prevent noisy signals from being forwarded to a conversion section.

Figure 23:
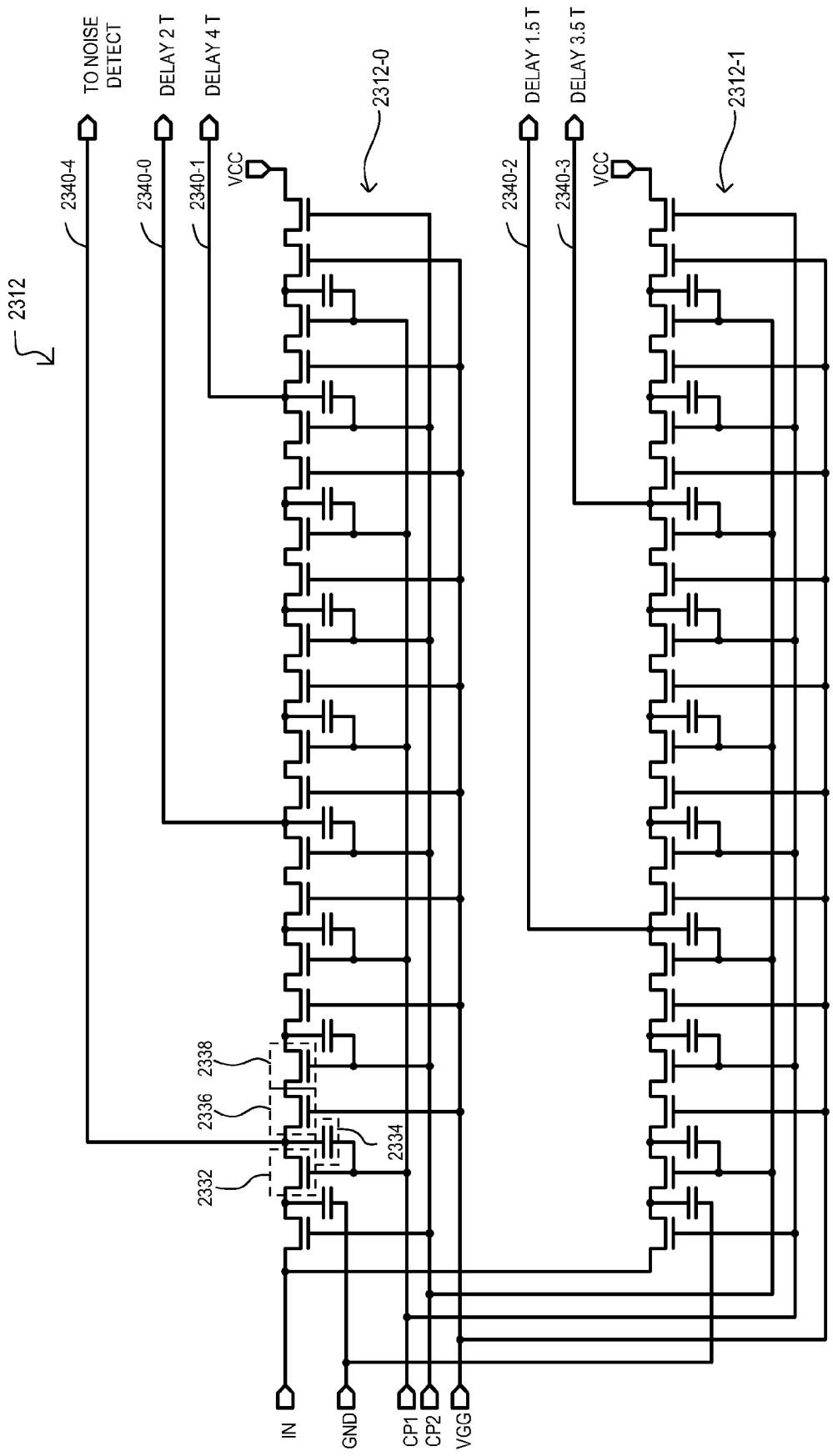
FIG. 23 is a schematic diagram of another delay section that can be included in embodiments.

FIG. 23 shows one example of a delay section 2312 that can be included in an embodiment like that of FIGS. 20 and/or 21. A delay section 2312 can take the form of that shown in FIG. 4, so like items are referred to by the same reference character but with the leading digits being "23" instead of "4".

FIG. 23 can differ from that of FIG. 4 in the shown tap locations 2340-0 to 2340-4. Tap locations 2340-0, 2340-1, 2340-2, and 2340-3 can provide delays of 2 T, 4 T, 1.5 T and 3.5 T, respectively. In addition, a tap location 2340-4 can provide a signal to a noise detector circuit having a delay of 0.5 T.

As in the case of FIG. 4, providing taps from consecutive half cycles (e.g., 1.5/2 T, 3.5/4 T) to a differential sample and hold circuit can provide full wave rectification of a sense cycle.

Embodiments above have shown systems, circuits and methods that can suppress noise in a capacitance sensing system by preventing noisy sense signals from being converted into sense data. However, in alternate embodiments, a measurement time can be adjusted to reduce noise effects. One particular embodiment having such noise reduction is shown in FIG. 24.

FIG. 24 shows a capacitance sensing system according to another embodiment 2400. A system 2400 can set a measurement period to a duration that is no less than an expected maximum noise period. In addition, such a measuring period can be synchronized with respect to signals giving rise to such noise.

In a particular embodiment, a sensing system utilizes a periodic measuring frequency, and such a frequency can be adjusted to be multiple of a repeated noise frequency. In such an arrangement, harmonics of periodic noise signal can be locate zeros of sensing system frequency response, and hence be substantially reduced or eliminated from the sensing operation.

In the particular embodiment of FIG. 24, a system 2400 can include a capacitance sense network 2402, a time measurement circuit 2401, a clock adjustment section 2403, a transmit clock generator 2405, and a transmit signal driver 2418.

A capacitance sensing system 2400 can operate in an environment in which some information regarding noise events is known. A measurement period can be adjusted to reduce adverse effects of this noise. In some embodiments, a system 2400 may operate in conjunction with a display device that generates noise in relation to a display timing clock. In the particular embodiment shown, sensing system 2400 can operate in conjunction with an LCD display device 2491 and LCD controller 2492, which operate according to a display clock LCD_Clk.

In the embodiment of FIG. 24, a system 2400 can execute a capacitance measuring operation by driving a TX_OUT signal on sense network 2402. A duration of such a measurement operation can depend upon a system clock SysCLK provided by a clock generator 2405. For example, a duration of a sense operation can be changed by changing a frequency of signal SysCLK or changing a number of clock pulses of SysCLK present in a measurement time, or combinations thereof.

In the embodiment shown, a measurement time can be changed by changing a prescalar value (Prescalar) applied to clock generator 2405. A clock generator 2405 can generate a clock signal SysCLK by scaling an input clock signal (CLK) according to the prescalar value. Accordingly, changes in a prescalar value can result in a frequency of TX_OUT being increased or decreased.

A time measurement circuit 2401 can determine a difference between a frequency of the TX clock (used to measure a capacitance) and a clock in a noise producing system. In the embodiment shown, a time measurement circuit 2401 can be a timer that compares a frequency of a display clock LCD_Clk to SysCLK. In particular, a time measurement circuit 2401 can have a capture period enabled by LCD_Clk during which counting occurs according to SysCLK. Thus, a resulting Count value (e.g., number of SysCLK cycles in a set number of LCD_Clk cycles) can reflect a difference in frequencies between LCD_Clk and SysCLK.

Based on such a difference in frequencies, a clock adjustment section 2403 can increase or decrease a SysCLK clock frequency, to thereby ensure a measurement period is at least as long as an expected noise duration. In the embodiment shown, a clock adjustment section 2403 can be a prescalar selector that selects a prescalar value for application to clock generator 2405 based on the difference in frequency between SysCLK and LCD_Clk. As will be shown below, selection of a prescalar value can be an iterative process.

In addition, measurement operations can be synchronized with the LCD_Clk. In the embodiment shown, transmit signal driver 2418 can initiate measurement operations in response to LCD_Clk.

FIG. 25 is timing diagram showing measurement operations according to embodiments. Waveform "LCD_Clk" shows a display clock generated by display controller 2492. Display operations performed in response to LCD_Clk can generate noise on a capacitance sense network. As shown in FIG. 25, it is known (by measurement, for example), that a maximum noise event duration (Max Noise Duration) on a capacitance sense network caused by a display operation can be four LCD_Clk clock cycles.

Waveform "TX_OUT Prescalar 1" shows a TX_OUT response corresponding to an initial prescalar setting. As shown, a resulting measurement time (Measurement Time 1) can be less than the maximum noise duration. Consequently, a measurement operation, such as a signal integration, would not integrate an entire noise event. In contrast, waveform "TX_OUT Prescalar 2" shows a TX_OUT response corresponding to an adjusted prescalar setting. The resulting measurement time (Measurement Time 2) can be no less than a maximum noise duration. Consequently, a measurement operation can integrate an entire noise event, which can reduce adverse affects of noise in the sensing operation.

FIG. 26 is table of experimental results corresponding to a system like that shown in FIG. 24. Row "TOUCH SIGNAL" shows a number of touches detected. Row "NOISE" shows the number of "false" touches created by noise. Row "SNR" shows a signal-to-noise ratio (i.e., TOUCH SIGNAL divided by NOISE).

As shown in the NO LCD case, where an LCD is not operating, a SNR of 25 can be achieved. When the LCD is operational (LCD column), but capacitance measurements are not synchronized or scaled based on expected noise, a SNR of 3.3 results. However, when measurements are synchronized and scaled based on expected noise, a SNR of 7 can be achieved, an improvement of greater than two times.

Figure 27:
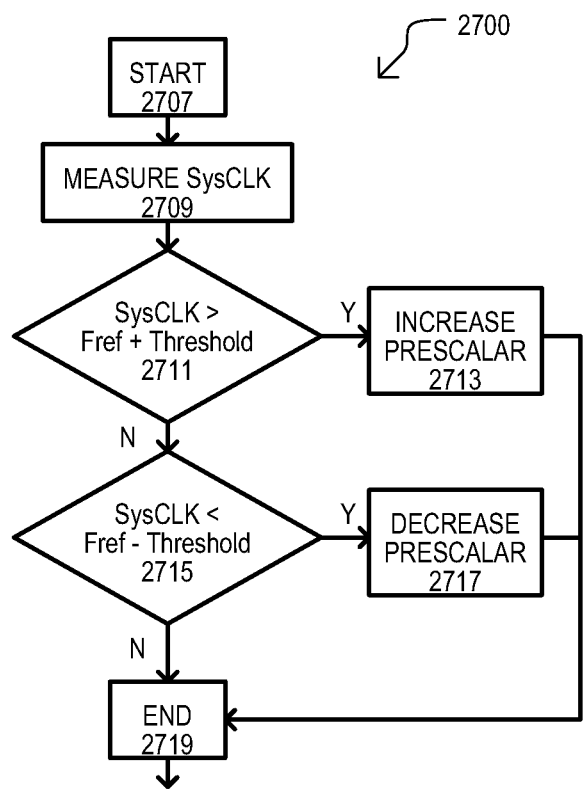
FIG. 27 is a flow diagram showing a measurement period setting operation according to an embodiment.

FIG. 27 shows a prescalar adjustment operation 2700 according to an embodiment. An operation 2700 can include, upon start (2707), measuring a source clock signal (2709). A source clock signal can be a signal that determines a duration of a measurement period, where the measurement period is the time during which signal values corresponding to capacitance are induced and/or acquired, but not necessarily fully processed.

If a source clock signal is greater than a reference frequency plus some threshold (Y from 2711), a prescalar value can be increased (2713), to thereby reduce a frequency of the source clock (and hence increase a measurement time). Conversely, if a source clock signal is less than a reference frequency minus some threshold (Y from 2715), a prescalar value can be decreased (2717), to thereby increase a frequency of the source clock (and hence decrease a measurement time).

In particular embodiments, an operation 2700 can be steps executed by a processor based on stored instructions.

Embodiments can be utilized in capacitance sense systems to reduce adverse effects of noise. In particular embodiments, noise on a capacitance sense network of a touch screen that arises from the corresponding display can be suppressed or reduced. Other embodiments can address different noise sources, including but not limited to: noise arising from low frequency battery charges and/or switching power supplies.

Embodiments of the invention can utilize one or more electrodes of a capacitance sense network to detect the presence of noise. In some embodiments, one or more receive electrodes of a mutual capacitance sense network can be utilized to sense noise. In addition or alternatively, one or more unused (i.e., not driven with a transmit signal) transmit electrodes can be used for noise detection.

Embodiments of the invention can utilize sense signals generated from a capacitance sense network to sense noise. In some embodiments, signals from multiple channels can be added together to sense noise.

Embodiments of the invention can reduce noise by starting a measurement period based on a known trigger of a noise event. In addition or alternatively, a duration of a measurement period can be adjusted to encompass an expected maximum noise event duration.

Embodiments of the invention can also reduce noise by using a periodic measuring (sensing) frequency that is a multiple of a repeated noise frequency so that harmonics of the periodic noise are located at zeros of the sensing system frequency response.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A capacitance sensing system, comprising:
a noise detector coupled to a capacitance sensing network that generates a noise detect signal in response to noise;
a delay circuit coupled to generate at least two different delayed sense signals in response to outputs from the capacitance sensing network; and
a switch circuit that selectively outputs at least one of the delayed sense signals in response to the noise detect signal.

2. The capacitance sensing system claim 1, wherein:
the noise detector comprises
at least one comparator circuit having an input coupled to the capacitance sense network, and
a pulse generator that generates a pulse in response to an output of the comparator circuit.

3. The capacitance sensing system claim 1, wherein:
the capacitance sensing network comprises
a transmit circuit that transmits a first signal to at least one transmit electrode in the capacitance sensing network; and
receive electrodes that generate sense signals in response to the first signal, at least one receive electrode being coupled to the noise detector.

4. The capacitance sensing system claim 1, wherein:
the capacitance sensing network comprises
a transmit circuit that transmits a first signal to at least one transmit electrode in the capacitance sensing network, at least one transmit electrode being coupled to the noise detector; and
receive electrodes that generate sense signals in response to the first signal.

5. The capacitance sensing system claim 1, further including:
a charge to voltage converter coupled between the capacitance sensing network and the delay circuit that converts charge values received from the capacitance sensing network to voltage values.

6. The capacitance sensing system claim 1, wherein:
the delay circuit includes a switched capacitor delay line having a plurality of tap locations, each tap location providing a different one of the delayed sense signals.

7. The capacitance sensing system claim 6, wherein:
the capacitance sensing network outputs a periodic signal; and
the switched capacitor delay line rectifies the periodic signal.

8. The capacitance sensing system claim 1, further including:
a display device physically coupled to the capacitance sensing network that serves as a source of noise for the capacitance sensing network.

9. The capacitance sensing system claim 8, wherein:
the display device comprises a liquid crystal display.

10. The capacitance sensing system claim 1, further including:
a conversion circuit coupled to the output of the switch circuit that generates a digital value corresponding to a voltage of a received delayed sense signal.

11. The capacitance sensing system claim 10, wherein:
the conversion circuit is configured to alter at conversion time to generate the digital value in response to the noise detect signal.

12. The capacitance sensing system claim 1, wherein:
the noise detector comprises
a first comparator having one input coupled to receive an output from the capacitance sensing network and another input coupled to a first reference value, and
a second comparator having one input coupled to receive the output from the capacitance sensing network and another input coupled to a second reference value.

13. The capacitance sensing system claim 1, wherein:
the delay circuit comprises a rectifier circuit;
the noise detector comprises
a low pass filter (LPF) having an input coupled to an output of the rectifier circuit,
a first comparator having one input coupled to an output of the delay circuit, and a second input coupled to an output of the LPF, and
a second comparator having one input coupled to the output of the delay circuit, and a second input coupled to an output of the LPF.

14. The capacitance sensing system claim 1, wherein:
the noise detector comprises
a first comparator having one input coupled to an output of the capacitance sensing network, and a second input coupled to receive a delayed sense signal from the delay circuit, and a second comparator having one input coupled to the output of the capacitance sensing network, and a second input coupled to receive the delayed sense signal from the delay circuit.

* * * * *